(12) United States Patent
Sun et al.

(10) Patent No.: US 8,796,537 B2
(45) Date of Patent: Aug. 5, 2014

(54) CARBON NANOTUBE BASED SOLAR CELL

(75) Inventors: Hai-Lin Sun, Beijing (CN); Kai-Li Jiang, Beijing (CN); Qun-Qing Li, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 361 days.

(21) Appl. No.: 12/339,348

(22) Filed: Dec. 19, 2008

(65) Prior Publication Data

US 2009/0223558 A1    Sep. 10, 2009

(30) Foreign Application Priority Data

Mar. 7, 2008 (CN) .......................... 2008 1 0065797

(51) Int. Cl.
*H01L 31/00* (2006.01)
*H01L 31/0236* (2006.01)
*H01L 31/068* (2012.01)

(52) U.S. Cl.
USPC ........... 136/256; 136/255; 136/258; 136/261; 977/742; 977/932; 977/948

(58) Field of Classification Search
USPC ............... 136/255–256, 258, 261; 428/34.1; 423/447.3, 408; 977/742, 932, 948
See application file for complete search history.

(56) References Cited

U.S. PATENT DOCUMENTS

| | | | |
|---|---|---|---|
| 5,100,478 A | 3/1992 | Kawabata | |
| 5,330,584 A * | 7/1994 | Saga et al. | 136/255 |
| 6,262,359 B1 * | 7/2001 | Meier et al. | 136/256 |
| 7,691,533 B2 | 4/2010 | Sano et al. | |
| 7,704,480 B2 | 4/2010 | Jiang et al. | |
| 2002/0130605 A1 | 9/2002 | Mueller et al. | |
| 2004/0028875 A1 | 2/2004 | Van Rijn et al. | |
| 2004/0074531 A1 | 4/2004 | Matsui et al. | |
| 2004/0123897 A1 * | 7/2004 | Ojima et al. | 136/256 |
| 2004/0177878 A1 | 9/2004 | Maruyama | |
| 2005/0098204 A1 | 5/2005 | Roscheisen et al. | |

(Continued)

FOREIGN PATENT DOCUMENTS

| | | |
|---|---|---|
| CN | 1933210 | 3/2007 |
| CN | 1937258 | 3/2007 |

(Continued)

OTHER PUBLICATIONS

Pillai et al., Surface Plasmon enhanced silicon solar cells, Journal of Applied Physics, May 7, 2007, vol. 101, No. 9, pp. 093105-1-093105-8.

(Continued)

*Primary Examiner* — Jonathan Johnson
*Assistant Examiner* — Andrew Golden
(74) *Attorney, Agent, or Firm* — Novak Druce Connolly Bove + Quigg LLP

(57) ABSTRACT

A solar cell includes a back electrode, a silicon substrate, a doped silicon layer and an upper electrode. The back electrode is located on and electrically connected to a lower surface of the silicon substrate. A number of cavities are formed on an upper surface of the silicon substrate. The doped silicon layer is located on the inside surface of the cavities. The upper electrode is located on the upper surface of the silicon substrate. The upper electrode includes a carbon nanotube structure.

20 Claims, 4 Drawing Sheets

(56) References Cited

U.S. PATENT DOCUMENTS

| | | |
|---|---|---|
| 2005/0268963 A1 | 12/2005 | Jordan et al. |
| 2006/0055392 A1 | 3/2006 | Passmore et al. |
| 2006/0062944 A1* | 3/2006 | Gardner et al. ............... 428/34.1 |
| 2006/0067871 A1* | 3/2006 | Hart et al. .................. 423/447.3 |
| 2007/0006914 A1 | 1/2007 | Lee |
| 2007/0026645 A1 | 2/2007 | Lieber et al. |
| 2007/0119496 A1 | 5/2007 | Baldo et al. |
| 2007/0153362 A1 | 7/2007 | Gruner |
| 2007/0240757 A1* | 10/2007 | Ren et al. ...................... 136/256 |
| 2007/0256728 A1 | 11/2007 | Cousins |
| 2007/0273264 A1 | 11/2007 | Choi et al. |
| 2007/0277874 A1* | 12/2007 | Dawson-Elli et al. ........ 136/256 |
| 2007/0284987 A1 | 12/2007 | Liu et al. |
| 2007/0289623 A1* | 12/2007 | Atwater ........................ 136/252 |
| 2008/0066802 A1 | 3/2008 | Reddy |
| 2008/0211101 A1 | 9/2008 | Han et al. |

FOREIGN PATENT DOCUMENTS

| | | |
|---|---|---|
| CN | 1996620 | 7/2007 |
| JP | S57-130483 | 8/1982 |
| JP | S59-23570 | 2/1984 |
| JP | H05-21821 | 1/1993 |
| JP | H05-243594 | 9/1993 |
| JP | H05-335614 | 12/1993 |
| JP | H06-77511 | 3/1994 |
| JP | H11-103080 | 4/1999 |
| JP | 2002-520818 | 7/2002 |
| JP | 2003-179241 | 6/2003 |
| JP | 2003-209270 | 7/2003 |
| JP | 2004-64028 | 2/2004 |
| JP | 2005-327965 | 11/2005 |
| JP | 2006-171336 | 6/2006 |
| JP | 2006-210780 | 8/2006 |
| JP | 2007-96136 | 4/2007 |
| JP | 2007-115806 | 5/2007 |
| JP | 2007-126338 | 5/2007 |
| JP | 2007161563 | 6/2007 |
| JP | 2007161576 | 6/2007 |
| JP | 2009-117463 | 5/2009 |
| TW | 200511632 | 3/2005 |
| TW | 200520243 | 6/2005 |
| TW | 200629581 | 8/2006 |
| TW | 200703698 | 1/2007 |
| TW | 319521 | 9/2007 |
| TW | 200738553 | 10/2007 |
| TW | 200800798 | 1/2008 |
| WO | WO2004068548 | 8/2004 |
| WO | WO2007015710 | 2/2007 |
| WO | WO2007-037343 | 4/2007 |

OTHER PUBLICATIONS

Somani et al., Application of metal nanoparticles decorated carbon nanotubes in photovoltaics, Applied Physics Letters, Jul. 25, 2008, vol. 93, No. 3, pp. 033315.

Wei et al., Double-Walled Carbon Nanotube Solar Cells, Nano Letters, Jul. 3, 2007, vol. 7, No. 8, pp. 2317-2321.

Liu et al., Controlled growth of super-aligned carbon nanotube arrays for spinning continuous unidirectional sheets with tunable physical properties, Nano Letters vol. 8, No. 2, 700-705(2008).

Jiang et al. "Spinning continuous carbon nanotube yarns" Oct. 24, 2002, Nature, vol. 419, p. 801.

Contreras et al. "Replacement of Transparent Conductive Oxides by Single-Wall Carbon Nanotubes in Cu(In,Ga)Se2-Based Solar Cells" The Journal of Physical Chemistry C Letters, 2007, 06, 09, vol. 111, p. 1405-14048.

Wu et al. "Transparent, Conductive Carbon Nanotube Films" Science, 2004, 08, 27, vol. 305, No. 5688, p. 1273-1276.

* cited by examiner

US 8,796,537 B2

CARBON NANOTUBE BASED SOLAR CELL

This application is related to commonly-assigned applications entitled, "SOLAR CELL", Ser. No. 12/339,353, filed on Dec. 19, 2008; "SOLAR CELL", Ser. No. 12/339,359, filed on Dec. 19, 2008; "SOLAR CELL", Ser. No. 12/339,364, filed on Dec. 19, 2008; "SOLAR CELL", Ser. No. 12/339,370, filed on Dec. 19, 2008; and "SOLAR CELL", Ser. No. 12/339,379, filed Dec. 19, 2008. The disclosures of the above-identified applications are incorporated herein by reference.

BACKGROUND

1. Field of the Invention

The present invention relates to solar cells and, particularly, to a carbon nanotube based solar cell.

2. Discussion of Related Art

Solar cells can be classified as source materials such as silicon-based (single crystal, poly-crystalline and amorphous) solar cells and compound semiconductor-based solar cells. Among others, solar cells using single crystal silicon substrates are most widely fabricated by virtue of their excellent efficiency in energy conversion and low production cost.

Referring to FIG. 4, the solar cell 30 includes a back electrode 32, a silicon substrate 34, a doped silicon layer 36 and an upper electrode 38 according to the prior art. The back electrode 32 is located on and electrically connected to a lower surface 340 of the silicon substrate 34. A number of cavities 342 are defined in an upper surface 344 of the silicon substrate 34. The doped silicon layer 36 is located on an inside surface 346 of the cavities 342. The upper electrode 38 is located on the upper surface 344 of the silicon substrate 34. The upper electrode 38 includes a conductive metal grid used to increase the transmission of sunlight. However, since the conductive metal isn't transparent, transparent indium tin oxide (ITO) is selected to form the upper electrode 38. Furthermore, the indium tin oxide isn't mechanically and chemically durable, and the distribution of the resistance isn't uniform. As a result, the durability and the photoelectric conversion efficiency are relatively low.

What is needed, therefore, is to provide a solar cell with high photoelectric conversion efficiency and durability, in addition to a uniform distribution of resistance.

SUMMARY

A solar cell includes a back electrode, a silicon substrate, a doped silicon layer and an upper electrode. The back electrode is located on and electrically connected to a lower surface of the silicon substrate. A number of cavities are formed on an upper surface of the silicon substrate. The doped silicon layer is located on the inside surface of the cavities. The upper electrode is located on the upper surface of the silicon substrate. The upper electrode includes a carbon nanotube structure.

Other novel features and advantages of the present solar cell will become more apparent from the following detailed description of preferred embodiments when taken in conjunction with the accompanying drawings.

BRIEF DESCRIPTION OF THE DRAWINGS

Many aspects of the present solar cell can be better understood with references to the following drawings. The components in the drawings are not necessarily drawn to scale, the emphasis instead being placed upon clearly illustrating the principles of the present solar cell.

Figure 1:
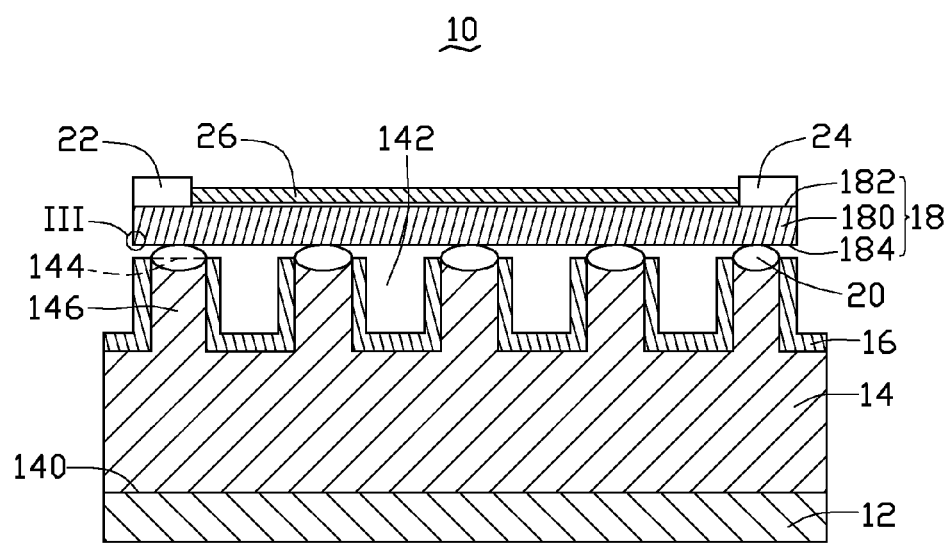
FIG. 1 is a schematic, side view of a solar cell, in accordance with an exemplary embodiment.

Corresponding reference characters indicate corresponding parts throughout the several views. The exemplifications set out herein illustrate at least one embodiment of the solar cell, in at least one form, and such exemplifications are not to be construed as limiting the scope of the invention in any manner.

DETAILED DESCRIPTION OF EXEMPLARY EMBODIMENTS

References will now be made to the drawings to describe, in detail, embodiments of the solar cell.

Figure 3:
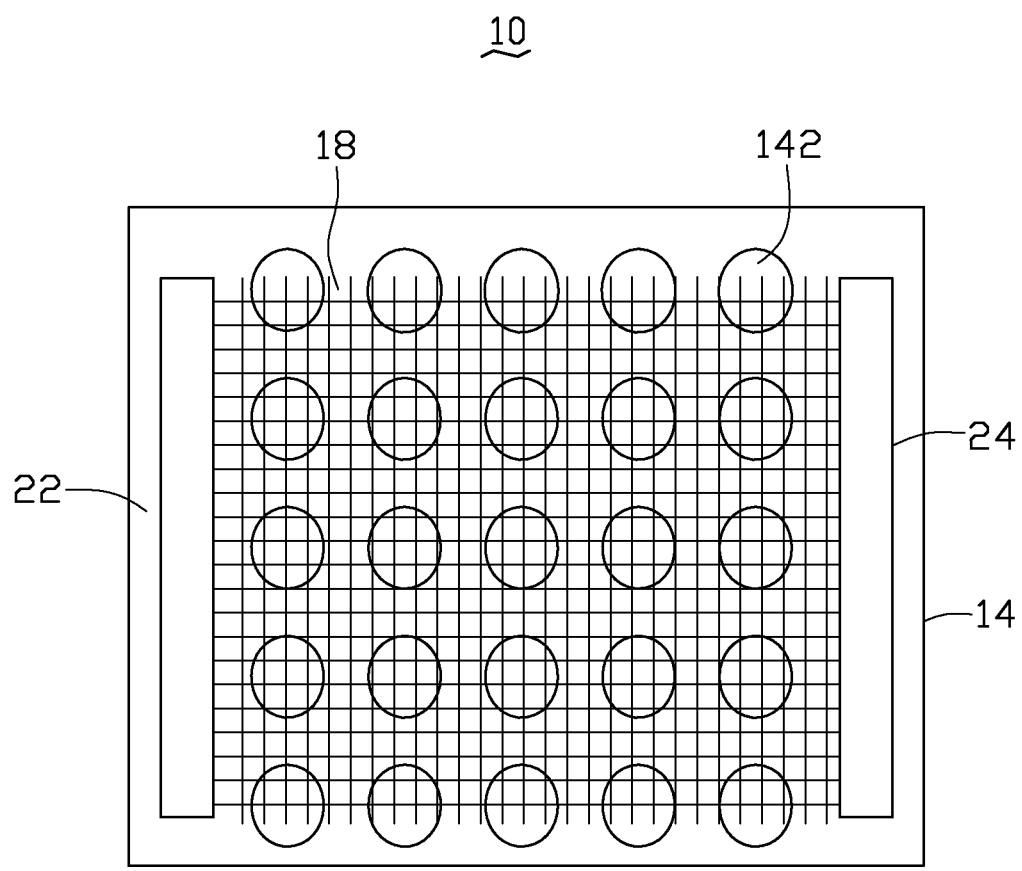
FIG. 3 is a schematic, op view of the solar cell of FIG. 1.
Figure 4:
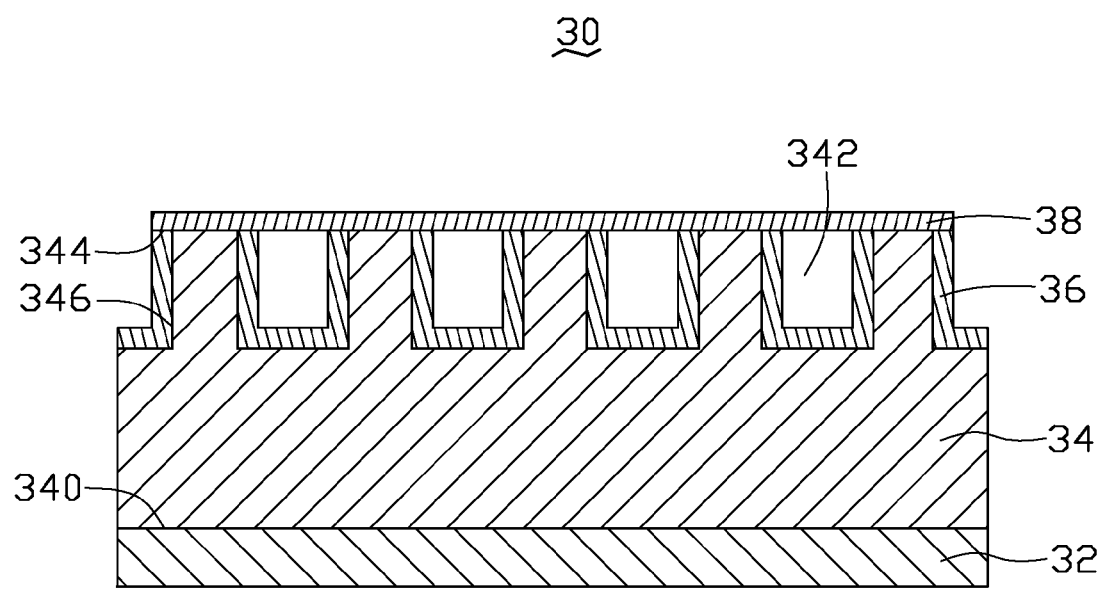
FIG. 4 is a schematic view of a conventional solar cell according to the Prior Art.

Referring to FIG. 1 and FIG. 3, a solar cell 10 includes a back electrode 12, a silicon substrate 14, a doped silicon layer 16 and an upper electrode 18. The back electrode 12 is located on and electrically connected to a lower surface 140 of the silicon substrate 14. A number of cavities 142 are formed on an upper surface 144 of the silicon substrate 14. The doped silicon layer 16 is located on an inside surface 146 of the cavities 142. The upper electrode 18 is located on the upper surface 144 of the silicon substrate 14.

The solar cell 10 can further include a plurality of metal layers 20. The metal layers 20 are made of aluminum or silver. The metal layers 20 are located on the upper surface 144 of the silicon substrate 14, and a plurality of heterojunctions are formed between the upper surface 144 of the silicon substrate 14 and the upper electrode 18. Through the heterojunctions, the conductivity between the upper electrode 18 and the silicon substrate 14 is enhanced. Thus, the photoelectric conversion efficiency of the solar cell 10 is improved.

The solar cell 10 can further include at least one first electrode 22 and second electrode 24. The first electrode 22 and the second electrode 24 are made of silver or gold. The first electrodes 22 and the second electrodes 24 are separately located on and connected to an upper surface 182 of the upper electrode 18. The first electrodes 22 and the second electrodes 24 are used to collect the current of the upper electrode 18.

The solar cell 10 can further include an anti-reflection layer 26. The anti-reflection layer 26 is made of titanium dioxide and is located on the upper surface 182 or a lower surface 184 of the upper electrode 18. The anti-reflection layer 26 is used to reduce the sunlight reflection from the upper electrode 18, and thus, the photoelectric conversion efficiency of the solar cell 10 is improved.

The back electrode 12 can be made of silver, aluminum or magnesium. A thickness of the back electrode 12 approximately ranges from 10 to 300 microns.

The silicon substrate 14 of the present embodiment is a P-type single crystal silicon substrate. A thickness of the P-type single crystal silicon substrate approximately ranges from 200 to 300 microns, wherein uniform spacing exists in the adjacent cavities. The spacing between the adjacent cavities 142 approximately ranges from 10 to 30 microns, and a depth of the cavities 142 approximately ranges from 50 to 70 microns. A shape of the cavities 142 can be set as desired, and a cross section of the cavities 142 can be square, trapezial or triangular. The doped silicon layer 16 is an N-type doped silicon layer, and a thickness of the N-type doped silicon layer approximately ranges from 500 nanometers to 1 micron. A plurality of P-N junctions are formed between the N-type doped silicon layer and the P-type single crystal silicon substrate 14, achieving a conversion from solar radiation to electrical energy.

The upper electrode 18 includes a carbon nanotube structure. The carbon nanotube structure includes a plurality of uniformly distributed carbon nanotubes. The carbon nanotube structure includes at least one ordered or disordered carbon nanotube film. In the disordered carbon nanotube film, the carbon nanotubes are disordered or isotropic. The disordered carbon nanotubes entangle with each other. The isotropic carbon nanotubes are parallel to a surface of the carbon nanotube film. The ordered carbon nanotube film includes a plurality of carbon nanotubes aligned orderly, and the carbon nanotubes therein are oriented along one or different directions (e.g., two directions perpendicular to each other). The ordered carbon nanotube film is directly formed by drawing from a carbon nanotube array.

The carbon nanotubes of the carbon nanotube structure can be selected from a group comprising of single-walled carbon nanotubes, double-walled carbon nanotubes, multi-walled carbon nanotubes, and combinations thereof. A diameter of the carbon nanotubes approximately ranges from 0.5 to 50 nanometers. The carbon nanotube film structure can be directly adhered on the upper surface 144 of the silicon substrate 14 and cover openings of the cavities 142 due to its high purity and a large surface area of the carbon nanotubes.

Figure 2:
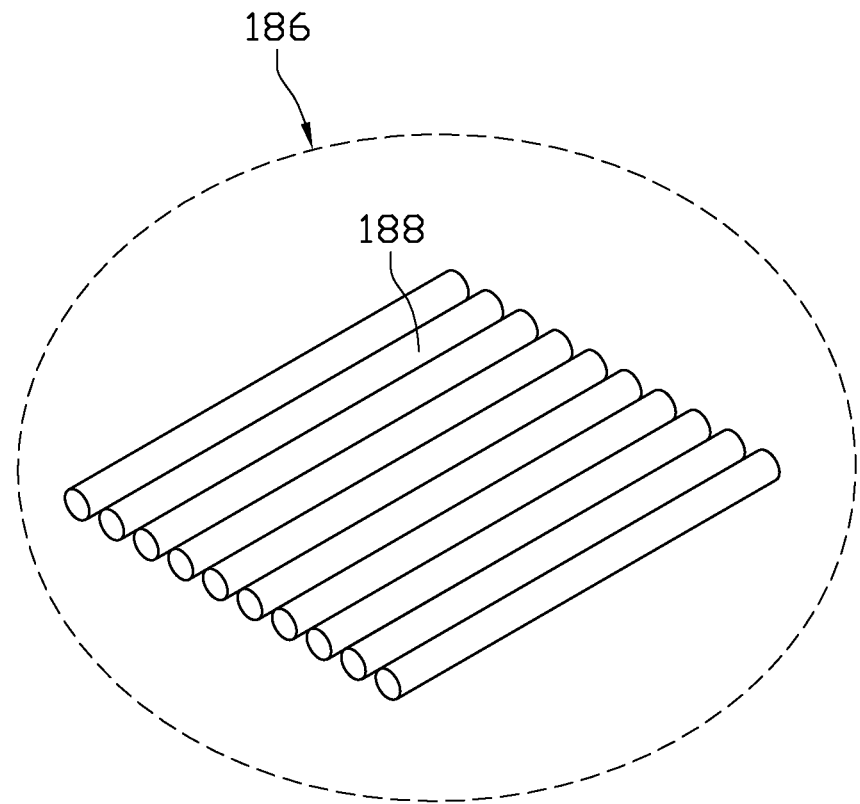
FIG. 2 is an amplified view of an ordered carbon nanotube segment used in the solar cell of FIG. 1.

In this embodiment, the upper electrode 18 includes at least one carbon nanotube film 180. The carbon nanotube film 180 is an ordered film, and includes a plurality of carbon nanotubes parallel to a surface of the carbon nanotube film 180. Further, the carbon nanotube film 180 includes a plurality of continuously oriented and substantially parallel-arranged carbon nanotube segments 186 joined end-to-end by van der Waals attractive force. The carbon nanotube segments can vary in width, thickness, uniformity and shape. Referring to FIG. 2, each carbon nanotube segment 186 includes a plurality of substantially parallel-arranged carbon nanotubes 188, wherein the carbon nanotubes 188 have an approximately the same length and are substantially parallel to each other. Adjacent carbon nanotubes 188 are attracted by van der Waals attractive force.

In this embodiment, the width of the carbon nanotube film 180 approximately ranges from 0.5 nanometers to 10 centimeters, and the thickness of the carbon nanotube film 180 approximately ranges from 0.01 to 100 microns. The length of the carbon nanotube film 180 is arbitrary.

Furthermore, the upper electrode 18 includes at least two stacked carbon nanotube films 180. Each carbon nanotube film 180 includes a plurality of carbon nanotubes oriented along one direction. An angle between the aligned directions of the carbon nanotubes in any two adjacent carbon nanotube films 180 ranges from 0° to 90°.

The sunlight irradiates the cavities 142 of the solar cell 10 through interspaces between the adjacent carbon nanotubes. Next, the sunlight can repeatedly be reflected by the inner surfaces of the cavities 142, and as a result, the light absorption of the upper surface 144 of the silicon substrate 14 is improved. A plurality of p-n junctions that receive impinging radiation are formed at the interface of the p-type silicon substrate and the n-type doped silicon layer. Radiated photos create mobile carriers (hole-electron pairs), and the hole-electron pairs are separated to form a plurality of holes and electrons by the electrostatic potential energy. The electrons in the n-type doped silicon layer move to the carbon nanotube structure, and the holes in the p-type silicon substrate move to the back electrode 12. Finally, the holes are collected by the back electrode 12 and the upper electrode 18, and a electric current goes through an electrical circuit outside of the solar cell 10.

Compared to conventional solar cells, the present solar cell 10 has the following advantages: (1) the solar cell 10 has a high photoelectric conversion efficiency due to the excellent light absorbing properties of the carbon nanotubes; (2) the solar cell 10 is durable due to the toughness of the carbon nanotubes; (3) the carbon nanotube structure is obtained by using a tool to draw out the array of carbon nanotubes, and the cost of the solar cell 10 is relatively low; (4) the upper electrode has a uniform resistance distribution due to the uniform structure of the carbon nanotube structure, and the efficiency of the solar cell is improved; and (5) the light transmission is improved due to the interspaces between the adjacent carbon nanotubes.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A solar cell comprising:
    a silicon substrate having an upper surface and a lower surface, the upper surface defining a plurality of cavities, each of the plurality of cavities having an inside surface, wherein the inside surface connects to the upper surface;
    a back electrode adjacent to the lower surface of the silicon substrate, and electrically connected to the silicon substrate;
    a doped silicon layer located on the inside surface;
    an upper electrode located on the upper surface of the silicon substrate, wherein the upper electrode covers the plurality of cavities and is suspended above the inside surface of each of the plurality of cavities, and the upper electrode comprises a carbon nanotube structure; and
    a plurality of metal layers is located between the upper surface of the silicon substrate and the upper electrode, and the plurality of metal layers are in direct contact with the upper surface, the upper electrode, and the doped silicon layer.

2. The solar cell as claimed in claim 1, wherein the carbon nanotube structure comprises a disordered carbon nanotube film, the disordered carbon nanotube film comprises a plurality of uniformly distributed carbon nanotubes disorderly aligned.

3. The solar cell as claimed in claim 1, wherein the carbon nanotube structure comprises at least one ordered carbon nanotube film, the at least one ordered carbon nanotube film comprises a plurality of carbon nanotubes aligned along substantially a same direction and substantially parallel to the upper surface of the silicon substrate.

4. The solar cell as claimed in claim 3, wherein the at least one ordered carbon nanotube film is formed by drawing from a carbon nanotube array, the at least one ordered carbon nanotube film is suspended above the plurality of cavities.

5. The solar cell as claimed in claim 4, wherein the at least one ordered carbon nanotube film comprises a plurality of alike oriented carbon nanotube segments, and the plurality of alike oriented carbon nanotube segments are joined end-to-end by van der Waals attractive force.

6. The solar cell as claimed in claim 5, wherein the plurality of alike oriented carbon nanotube segments vary in width, thickness, uniformity and shape.

7. The solar cell as claimed in claim 5, wherein each of the plurality of alike oriented carbon nanotube segment comprises a plurality of substantially parallel carbon nanotubes.

8. The solar cell as claimed in claim 7, wherein adjacent carbon nanotubes of the plurality of substantially parallel carbon nanotubes are attracted to each other by van der Waals attractive force therebetween.

9. The solar cell as claimed in claim 3, wherein the at least one ordered carbon nanotube film comprises at least two directly stacked ordered carbon nanotube films.

10. The solar cell as claimed in claim 9, wherein an angle between the aligned directions of the plurality of carbon nanotubes in the at least two directly stacked ordered carbon nanotube films is in a range from 0° to 90°.

11. The solar cell as claimed in claim 1, wherein the silicon substrate is a P-type single crystal silicon substrate.

12. The solar cell as claimed in claim 11, wherein a thickness of the P-type single crystal silicon substrate ranges from about 200 microns to about 300 microns.

13. The solar cell as claimed in claim 1, wherein uniform spacing exists between adjacent cavities of the plurality of cavities.

14. The solar cell as claimed in claim 13, wherein the spacing ranges from about 10 microns to 30 microns, and a depth of the plurality of cavities ranges from about 50 microns to about 70 microns.

15. The solar cell as claimed in claim 1, further comprising a first electrode and second electrode, wherein the first electrode and the second electrode are separately located on and electrically connected to the upper electrode.

16. The solar cell as claimed in claim 1, further comprising an anti-reflection layer located on the upper electrode and covering the plurality of cavities.

17. The solar cell as claimed in claim 16, wherein the anti-reflection layer is made of titanium dioxide.

18. A solar cell comprising:
a silicon substrate having an upper surface and a lower surface, the upper surface defining a plurality of cavities, each of the plurality of cavities having an inside surface that is connected to the upper surface;
a back electrode adjacent to the lower surface of the silicon substrate and electrically connected to the silicon substrate;
a plurality of doped silicon layers, each of the plurality of doped silicon layers are located on the inside surface of each of the plurality of cavities;
a plurality of metal layers located between the upper surface of the silicon substrate and an upper electrode; and
a carbon nanotube film located on the plurality of metal layers and suspended above the inside surface of each of the plurality of cavities, the carbon nanotube film comprising a plurality of carbon nanotubes aligned along substantially a same direction and substantially parallel to the upper surface of the silicon substrate;
wherein the plurality of metal layers are in direct contact with the upper surface, the carbon nanotube film, and the doped silicon layer to form a plurality of heterojunctions between the upper surface of the silicon substrate and the carbon nanotube film.

19. A solar cell comprising:
a P-type single crystal silicon substrate having an upper surface and a lower surface, the upper surface defining a plurality of cavities, and each of the plurality of cavities having an inside surface that is connected to the upper surface;
a back electrode that is adjacent to the lower surface of the silicon substrate and electrically connected to the P-type single crystal silicon substrate;
a plurality of N-type doped silicon layers, and each of the plurality of N-type doped silicon layers are located on the inside surface of each of the plurality of cavities;
a plurality of metal layers located between the upper surface of the P-type single crystal silicon substrate and an upper electrode; and
a carbon nanotube film located on the plurality of metal layers and suspended above the inside surface of each of the plurality of cavities, and the carbon nanotube film comprises a plurality of carbon nanotubes aligned along substantially a same direction and substantially parallel to the upper surface of the P-type single crystal silicon substrate;
wherein a thickness of the P-type single crystal silicon substrate is about 200 microns to about 300 microns, the plurality of metal layers are in direct contact with the upper surface, the carbon nanotube film, and the N-type doped silicon layer to form a plurality of heterojunctions between the upper surface of the silicon substrate and the carbon nanotube film.

20. The solar cell as claimed in claim 19, further comprising an anti-reflection layer located on the carbon nanotube film and covering the plurality of cavities.

* * * * *